(12) United States Patent
Bessems et al.

(10) Patent No.: US 8,836,912 B2
(45) Date of Patent: Sep. 16, 2014

(54) FLUID HANDLING STRUCTURE, A LITHOGRAPHIC APPARATUS AND A DEVICE MANUFACTURING METHOD

(75) Inventors: David Bessems, Eindhoven (NL); Erik Henricus Egidius Catharina Eummelen, Eindhoven (NL); Rogier Hendrikus Magdalena Cortie, Ittervoort (NL); Marcus Johannes Van Der Zanden, Boekel (NL); Jimmy Matheus Wilhelmus Van De Winkel, Kessel (NL); Cornelius Maria Rops, Waalre (NL); Paul Willems, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 324 days.

(21) Appl. No.: 13/273,879

(22) Filed: Oct. 14, 2011

(65) Prior Publication Data

US 2012/0120376 A1    May 17, 2012

Related U.S. Application Data

(60) Provisional application No. 61/394,184, filed on Oct. 18, 2010.

(51) Int. Cl.
| | |
|---|---|
| *G03B 27/52* | (2006.01) |
| *G03B 27/42* | (2006.01) |
| *G03F 7/20* | (2006.01) |

(52) U.S. Cl.
CPC ................................ *G03F 7/70341* (2013.01)
USPC ............................................. 355/30; 355/53

(58) Field of Classification Search
CPC .................................................. G03F 7/70341
USPC ...................................... 355/30, 53; 250/548
See application file for complete search history.

(56) References Cited

U.S. PATENT DOCUMENTS

| | | | |
|---|---|---|---|
| 4,509,852 A | 4/1985 | Tabarelli et al. | |
| 5,900,354 A | 5/1999 | Batchelder | |
| 7,576,833 B2 * | 8/2009 | Poon et al. .................... | 355/53 |
| 7,649,611 B2 | 1/2010 | Zaal et al. | |

(Continued)

FOREIGN PATENT DOCUMENTS

| | | |
|---|---|---|
| EP | 1 420 298 | 5/2004 |
| EP | 1 482 372 | 12/2004 |

(Continued)

OTHER PUBLICATIONS

Japanese Office Action dated Jan. 15, 2013 in corresponding Japanese Patent Application No. 2011-226698.

(Continued)

*Primary Examiner* — Hung Henrynguyen
(74) *Attorney, Agent, or Firm* — Pillsbury Winthrop Shaw Pittman LLP

(57) ABSTRACT

A fluid handling structure for a lithographic apparatus, the fluid handling structure having, at a boundary from a space configured to contain immersion fluid to a region external to the fluid handling structure: a meniscus pinning feature to resist passage of immersion fluid in a radially outward direction from the space; a gas supply opening radially outward of the meniscus pinning feature; and a gas recovery opening radially outward of the meniscus pinning feature and at least partly surrounding the gas supply opening.

20 Claims, 10 Drawing Sheets

(56) References Cited

U.S. PATENT DOCUMENTS

| | | |
|---|---|---|
| 7,903,232 B2 | 3/2011 | Leenders et al. |
| 2004/0207824 A1 | 10/2004 | Lof et al. |
| 2006/0038968 A1 | 2/2006 | Kemper et al. |
| 2006/0050257 A1 | 3/2006 | Honda |
| 2006/0158627 A1 | 7/2006 | Kemper et al. |
| 2007/0085989 A1 | 4/2007 | Nagahashi et al. |
| 2007/0153244 A1 | 7/2007 | Zaal et al. |
| 2007/0243697 A1 | 10/2007 | Leenders et al. |
| 2008/0212046 A1* | 9/2008 | Riepen et al. .......... 355/30 |
| 2009/0134488 A1 | 5/2009 | Jansen et al. |
| 2009/0174871 A1* | 7/2009 | Petrus De Jong et al. ...... 355/30 |
| 2009/0279060 A1 | 11/2009 | Direcks et al. |
| 2009/0279062 A1 | 11/2009 | Direcks et al. |
| 2010/0066987 A1 | 3/2010 | Bruijstens et al. |
| 2010/0313974 A1 | 12/2010 | Riepen et al. |
| 2011/0134401 A1 | 6/2011 | Rops et al. |
| 2012/0062860 A1 | 3/2012 | Chonan |
| 2013/0155380 A1 | 6/2013 | Van Der Gaag et al. |

FOREIGN PATENT DOCUMENTS

| | | |
|---|---|---|
| JP | 2007-142366 | 6/2007 |
| JP | 2007-525007 | 8/2007 |
| JP | 2007-288187 | 11/2007 |
| JP | 2010-068003 | 3/2010 |
| JP | 2010-074160 | 4/2010 |
| KR | 10-2008-0075727 | 8/2008 |
| WO | 99/49504 | 9/1999 |

OTHER PUBLICATIONS

U.S. Appl. No. 61/376,167, filed Aug. 23, 2010, Paul Willems et al.

* cited by examiner

-- PRIOR ART --

-- PRIOR ART --

-- PRIOR ART --

-- PRIOR ART --

FLUID HANDLING STRUCTURE, A LITHOGRAPHIC APPARATUS AND A DEVICE MANUFACTURING METHOD

This application claims priority and benefit under 35 U.S.C. §119(e) to U.S. Provisional Patent Application No. 61/394,184, entitled "A Fluid Handling Structure, A Lithographic Apparatus and a Device Manufacturing Method", filed on Oct. 18, 2010. The content of that application is incorporated herein in its entirety by reference.

FIELD

The present invention relates to a fluid handling structure, a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

If the immersion liquid is confined by a fluid handling system to a localized area on the surface which is under the projection system, a meniscus extends between the fluid handling system and the surface. If the meniscus collides with a droplet on the surface, this may result in inclusion of a bubble in the immersion liquid. The droplet may be present on the surface for various reasons, including because of leaking from the fluid handling system. A bubble in immersion liquid can lead to imaging errors, for example by interfering with a projection beam during imaging of the substrate.

It is desirable, for example, to provide a lithographic apparatus in which the likelihood of bubble inclusion is at least reduced.

According to an aspect, there is provided a fluid handling structure for a lithographic apparatus, the fluid handling structure having, at a boundary from a space configured to contain immersion fluid to a region external to the fluid handling structure: a meniscus pinning feature to resist passage of immersion fluid in a radially outward direction from the space; a gas supply opening radially outward of the meniscus pinning feature; and a gas recovery opening radially outward of the meniscus pinning feature and at least partly surrounding the gas supply opening.

According to an aspect, there is provided A fluid handling structure for a lithographic apparatus, the fluid handling structure successively having, at a boundary from a space configured to contain immersion fluid to a region external to the fluid handling structure: a meniscus pinning feature to resist passage of immersion fluid in a radially outward direction from the space; a gas recovery opening radially outward of the meniscus pinning feature; and a gas supply opening radially outward of the gas recovery opening.

According to an aspect, there is provided a fluid handling structure for a lithographic apparatus, the fluid handling structure successively having, at a boundary from a space configured to contain immersion fluid to a region external to the fluid handling structure: a meniscus pinning feature to resist passage of immersion fluid in a radially outward direction from the space; a gas supply opening radially outward of the meniscus pinning feature; and a fluid supply opening, radially outward of the gas supply opening, to supply a soluble fluid soluble in the immersion fluid which soluble fluid on dissolution into the immersion fluid lowers the surface tension of the immersion fluid.

According to an aspect, there is provided a lithographic apparatus comprising: a fluid handling structure having, at a boundary from a space configured to contain immersion fluid to a region external to the fluid handling structure: a meniscus pinning feature to resist passage of immersion fluid in a radially outward direction from the space, and a gas supply opening radially outward of the meniscus pinning feature; and a thermal cover to thermally shield components from the fluid handling system, the thermal cover comprising a gas recovery opening radially outward of the meniscus pinning feature and at least partly surrounding the gas supply opening.

According to an aspect, there is provided a device manufacturing method, comprising: projecting a patterned beam of radiation through an immersion liquid confined to a space between a final element of projection system and a substrate; providing gas through an opening to a position adjacent a meniscus of the immersion liquid; and recovering gas from the opening through a gas recovery opening.

According to an aspect, there is provided a device manufacturing method, comprising: projecting a patterned beam of radiation through an immersion liquid confined to a space between a final element of projection system and a substrate; providing gas through an opening to a position adjacent a meniscus of the immersion liquid; providing a fluid soluble in the immersion fluid and which soluble fluid upon dissolution in the immersion fluid lowers the surface tension of a meniscus of the immersion fluid; and providing the soluble fluid to a fluid supply opening at a position radially outward of the position at which the gas is provided.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
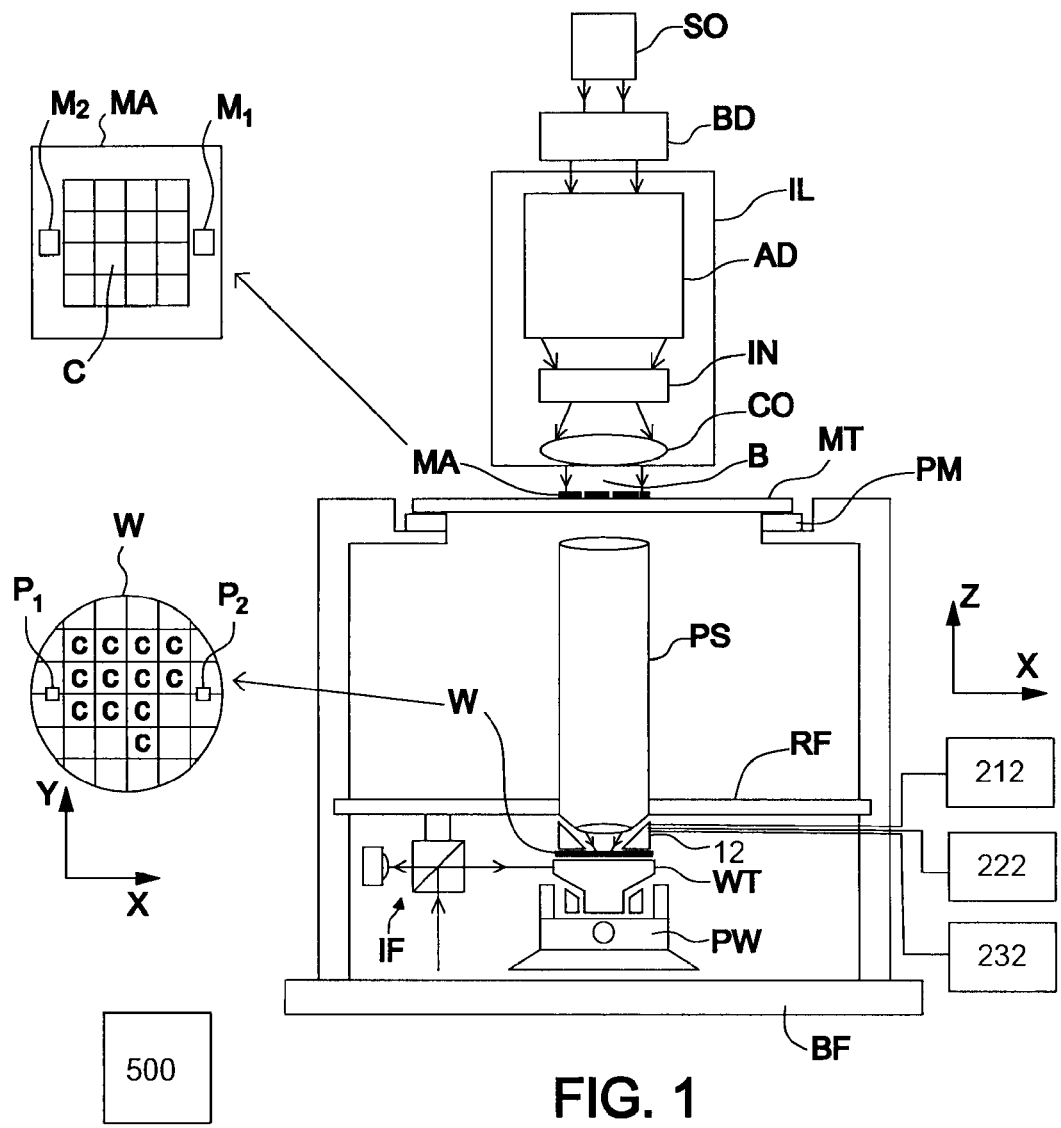
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions.

The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, sensor and measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-7 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
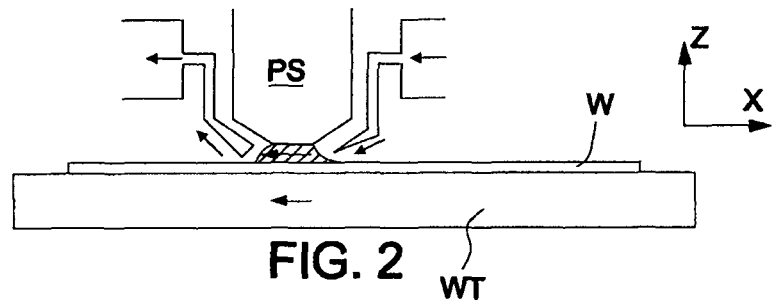
FIGS. 2 and 3 depict a liquid supply system for use in a lithographic projection apparatus.
Figure 3:
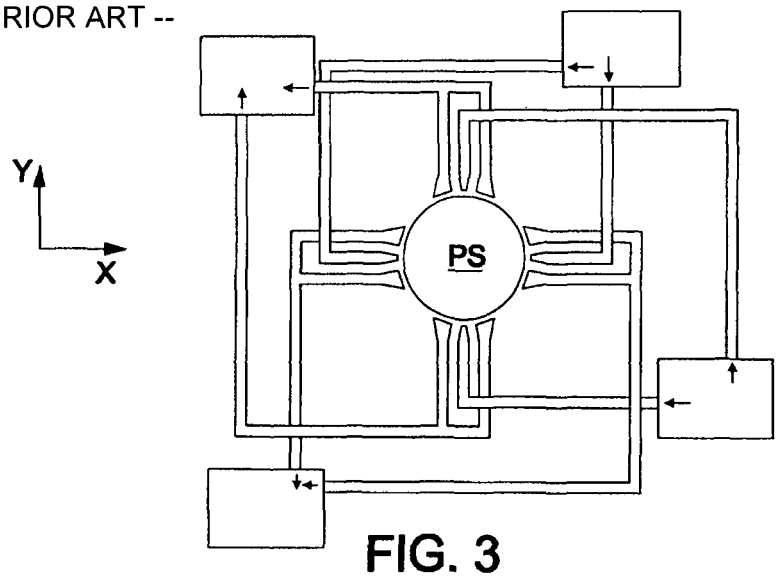

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
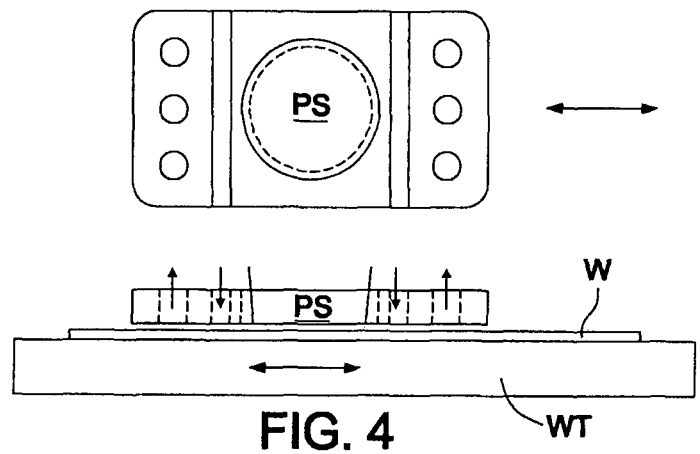
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

Figure 5:
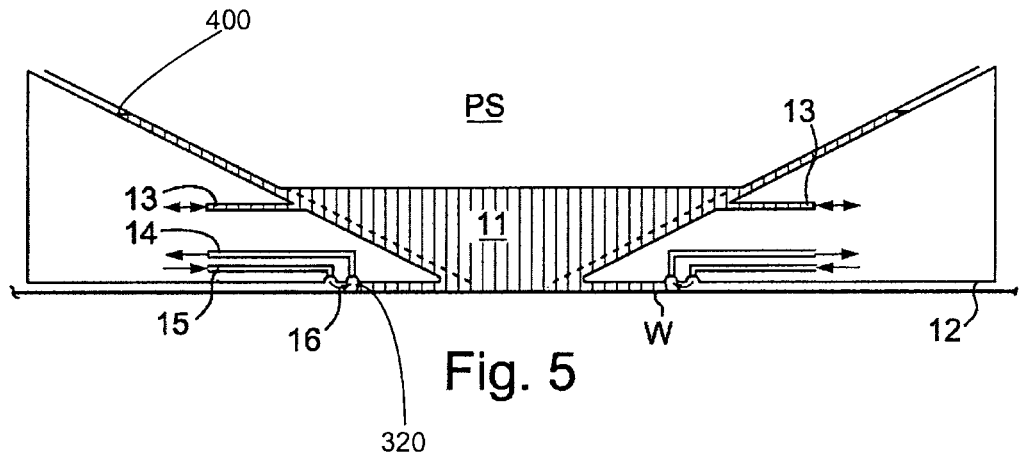
FIG. 5 depicts a further liquid supply system for use in a lithographic projection apparatus.

FIG. 5 schematically depicts a localized liquid supply system or fluid handling system with a liquid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The liquid confinement structure 12 is substantially stationary relative to the projection system in the XY plane though there may be some relative movement in the Z direction (in the direction of the optical axis). In an embodiment, a seal is formed between the liquid confinement structure 12 and the surface of the substrate W and may be a contactless seal such as a gas seal (such a system with a gas seal is disclosed in European patent application publication no. EP-A-1,420,298) or liquid seal.

The liquid confinement structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the liquid confinement structure 12 positioned below and surrounding the final element of the projection system PS. Liquid is brought into the space below the projection system PS and within the liquid confinement structure 12 by liquid inlet 13. The liquid may be removed by liquid outlet 13. The liquid confinement structure 12 may extend a little above the final element of the projection system. The liquid level rises above the final element so that a buffer of liquid is provided. In an embodiment, the liquid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the barrier member 12 and the surface of the substrate W. The gas seal is formed by gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the liquid confinement structure 12 does not have a gas seal.

Figure 6:
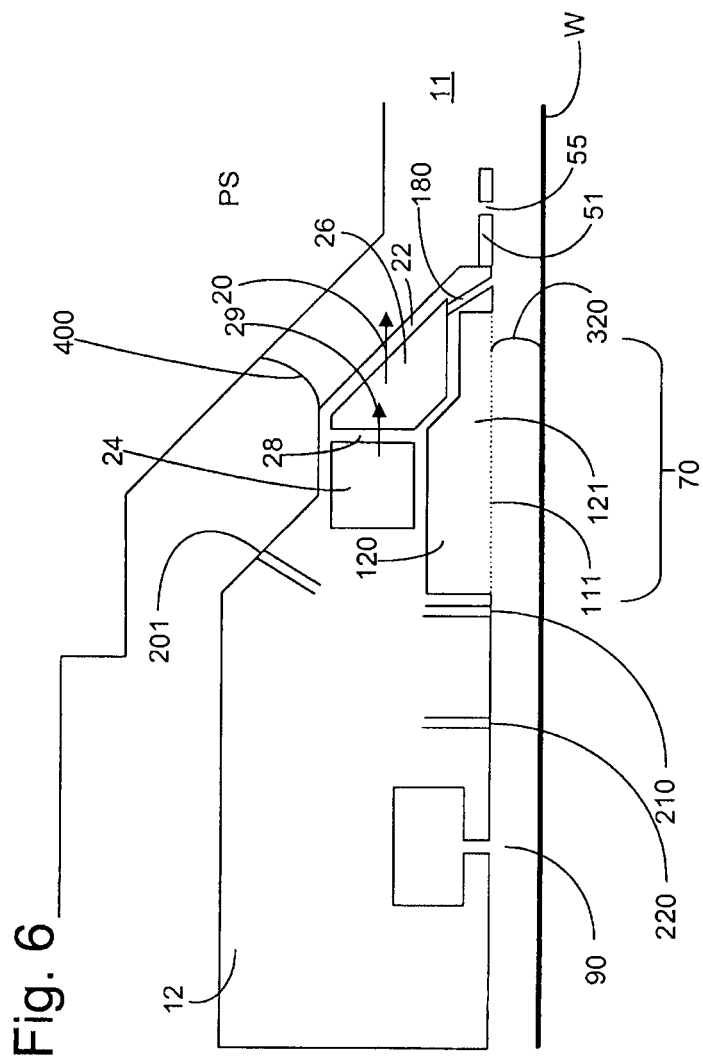
FIG. 6 depicts, in cross-section, a further liquid supply system for use in a lithographic projection apparatus.

FIG. 6 illustrates a liquid confinement structure 12 which is part of a liquid supply system. The liquid confinement structure 12 extends around the periphery (e.g. circumference) of the final element of the projection system PS.

A plurality of openings 20 in the surface which in part defines the space 11 provide the liquid to the space 11. The liquid passes through openings 29, 20 in side walls 28, 22 respectively through respective chambers 24, 26 prior to entering the space 11.

A seal is provided between the bottom of the liquid confinement structure 12 and a facing surface, e.g. the substrate W, or a substrate table WT, or both. In FIG. 6 a seal device is configured to provide a contactless seal and is made up of several components. Radially outwardly from the optical axis of the projection system PS, there is provided a (optional) flow control plate 51 which extends into the space 11. The control plate 51 may have an opening 55 to permit flow liquid therethrough; the opening 55 may be beneficial if the control plate 51 is displaced in the Z direction (e.g., parallel to the optical axis of the projection system PS). Radially outwardly of the flow control plate 51 on the bottom surface of the liquid confinement structure 12 facing (e.g., opposite) the facing surface, e.g., the substrate W, may be an opening 180. The opening 180 can provide liquid in a direction towards the facing surface. During imaging this may be useful in preventing bubble formation in the immersion liquid by filling a gap between the substrate W and substrate table WT with liquid.

Radially outwardly of the opening 180 may be an extractor assembly 70 to extract liquid from between the liquid confinement structure 12 and the facing surface. The extractor assembly 70 may operate as a single phase or as a dual phase extractor. The extractor assembly 70 acts as a meniscus pinning feature.

Radially outwardly of the extractor assembly may be a gas knife 90. An arrangement of the extractor assembly and gas knife is disclosed in detail in United States patent application publication no. US 2006/0158627 incorporated herein in its entirety by reference.

The extractor assembly 70 as a single phase extractor may comprise a liquid removal device, extractor or inlet such as the one disclosed in United States patent application publication no. US 2006-0038968, incorporated herein in its entirety by reference. In an embodiment, the liquid removal device 70 comprises an inlet which is covered in a porous material 111 which is used to separate liquid from gas to enable single-liquid phase liquid extraction. An under pressure in chamber 121 is chosen is such that the meniscuses formed in the holes of the porous material 111 prevent ambient gas from being drawn into the chamber 121 of the liquid removal device 70. However, when the surface of the porous material 111 comes into contact with liquid there is no meniscus to restrict flow and the liquid can flow freely into the chamber 121 of the liquid removal device 70.

The porous material 111 has a large number of small holes each with a dimension, e.g. a width, such as a diameter, in the range of 5 to 50 micrometers. The porous material 111 may be maintained at a height in the range of 50 to 300 micrometers above a surface, such as a facing surface, from which liquid is to be removed, e.g. the surface of a substrate W. In an embodiment, porous material 111 is at least slightly liquidphilic, i.e. having a dynamic contact angle of less than 90°, desirably less than 85° or desirably less than 80°, to the immersion liquid, e.g. water.

Although not specifically illustrated in FIG. 6, the liquid supply system has an arrangement to deal with variations in the level of the liquid. This is so that liquid which builds up between the projection system PS and the liquid confinement structure 12 can be dealt with and does not escape. One way of dealing with this liquid is to provide a lyophobic (e.g., hydrophobic) coating. The coating may form a band around the top of the liquid confinement structure 12 surrounding the opening and/or around the last optical element of the projection system PS. The coating may be radially outward of the optical axis of the projection system PS. The lyophobic (e.g., hydrophobic) coating helps keep the immersion liquid in the space 11.

Another localized area arrangement is a fluid handling system which makes use of a gas drag principle. The so-called gas drag principle has been described, for example, in United States patent application publication nos. US 2008-0212046, US 2009-0279060 and US 2009-0279062. In that system the extraction holes are arranged in a shape which may desirably have a corner. The corner may be aligned with a preferred direction of movement, such as the stepping or the scanning direction. This reduces the force on the meniscus between two openings in the surface of the fluid handing structure for a given speed in the preferred direction compared to if the two outlets were aligned perpendicular to the preferred direction. However, an embodiment of the invention may be applied to a fluid handling system which in plan has any shape, or has a component such as the extraction openings arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star.

In a variation of the system of US 2008/0212046 A1, to which an embodiment of the present invention may relate, the geometry of the cornered shape in which the openings are arranged allows sharp corners (between about 60° and 90°, desirably between 75° and 90° and most desirably between 75° and 85°) to be present for the corners aligned both in the scan and in the stepping directions. This allows increased speed in the direction of each aligned corner. This is because the creation of liquid droplets due to an unstable meniscus, for example in exceeding a critical speed, in the scanning direction is reduced. Where corners are aligned with both the scanning and stepping directions, increased speed may be achieved in those directions. Desirably the speed of movement in the scanning and stepping directions may be substantially equal.

Figure 7:
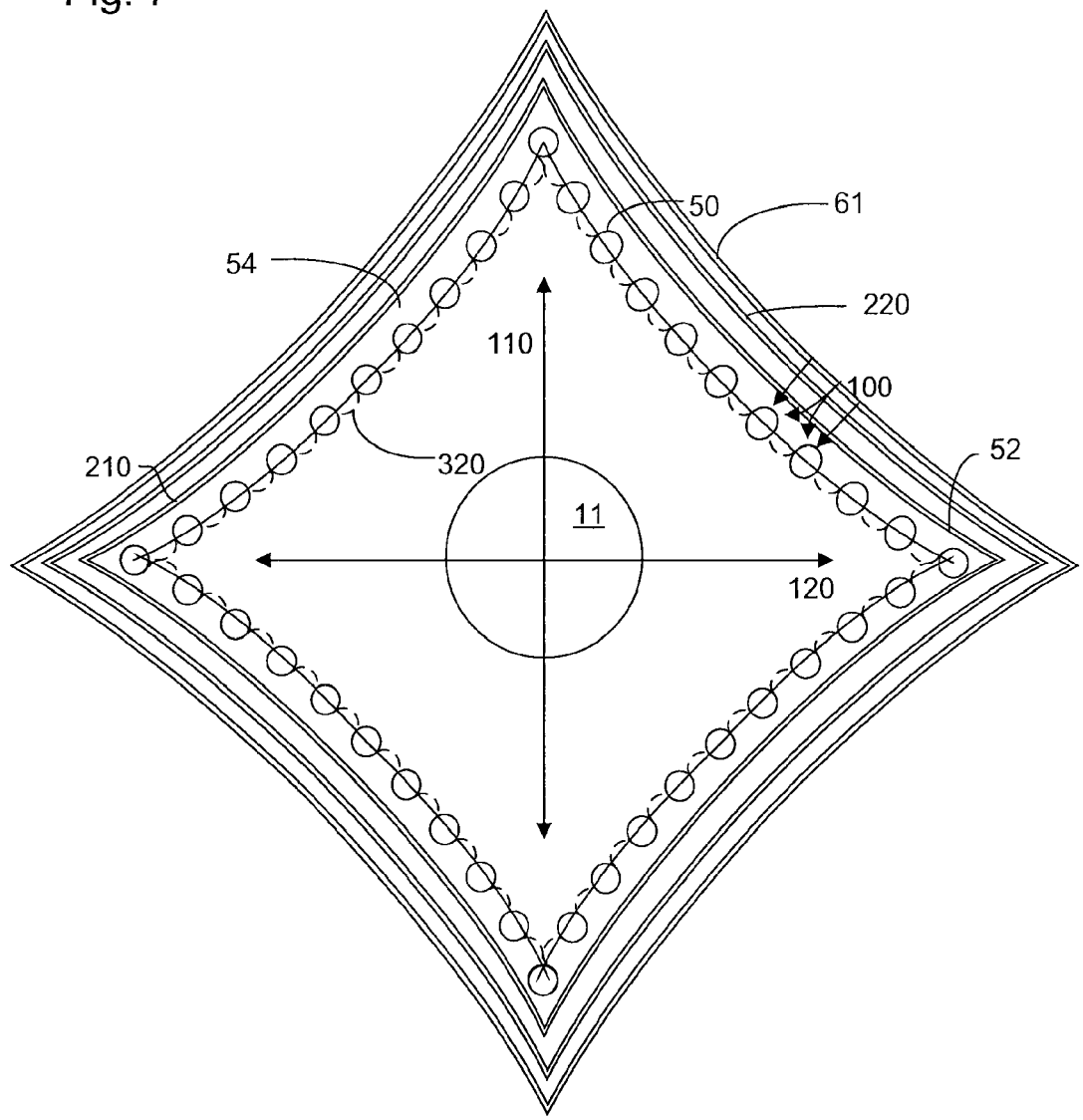
FIG. 7 depicts, in plan, a liquid supply system for use in a lithographic projection apparatus.

FIG. 7 illustrates schematically and in plan meniscus pinning features of a fluid handling system or of a liquid confinement structure 12 having an extractor embodying the gas drag principle and to which an embodiment of the present invention may relate. The features of a meniscus pinning device are illustrated which may, for example, replace the meniscus pinning arrangement 14, 15, 16 of FIG. 5 or at least the extractor assembly 70 shown in FIG. 6. The meniscus pinning device of FIG. 7 is a form of extractor. The meniscus pinning device comprises a plurality of discrete openings 50. Each opening 50 is illustrated as being circular, though this is not necessarily the case. Indeed one or more of the openings 50 may be one or more selected from: circular, elliptical, rectilinear (e.g. square, or rectangular), triangular, etc. and one or more openings may be elongate. Each opening has, in plan, a length dimension (i.e. in the direction from one opening to the adjacent opening) of greater than or equal to 0.2 mm, desirably greater than or equal to 0.5 mm or 1 mm, in an embodiment selected from the range of 0.1 mm to 10 mm, in one embodiment selected from the range of 0.25 mm to 2 mm. In an embodiment the width of each opening is selected from the range of 0.1 mm to 2 mm. In an embodiment the width of each opening is selected from the range of 0.2 mm to 1 mm. In an embodiment the length dimension is in the range of 0.2 mm to 0.5 mm, desirably in the range of 0.2 mm to 0.3 mm.

Each of the openings 50 of the meniscus pinning device of FIG. 7 may be connected to a separate under pressure source. Alternatively or additionally, each or a plurality of the openings 50 may be connected to a common chamber or manifold (which may be annular) which is itself held at an under pressure. In this way a uniform under pressure at each or a plurality of the openings 50 may be achieved. The openings 50 can be connected to a vacuum source and/or the atmosphere surrounding the fluid handling system (or confinement structure) may be increased in pressure to generate the desired pressure difference.

In the embodiment of FIG. 7 the openings are fluid extraction openings. Each opening is an inlet for the passage of gas, liquid, or a two phase fluid of gas and liquid, into the fluid handling system. Each inlet may be considered to be an outlet from the space 11.

The openings 50 are formed in a surface of a fluid handling structure 12. The surface faces the substrate W and/or substrate table WT, in use. In an embodiment the openings are in a flat surface of the fluid handling structure 12. In an embodiment, a ridge may be present on the bottom surface of the substrate member. At least one of the openings may be in the ridge. The openings 50 may be defined by needles or tubes. The bodies of some of the needles, e.g., adjacent needles, may be joined together. The needles may be joined together to form a single body. The single body may form the cornered shape.

The openings 50 are the end of a tube or elongate passageway, for example. Desirably the openings are positioned such that in use they are directed, desirably face, to the facing surface, e.g. the substrate W. The rims (i.e. outlets out of a surface) of the openings 50 may be substantially parallel to a top surface of a part of the facing surface. An elongate axis of the passageway to which the opening 50 is connected may be substantially perpendicular (within +/− 45°, desirably within 35°, 25° or even 15° from perpendicular) to the top of the facing surface, e.g., the top surface of the substrate W.

Each opening 50 is designed to extract a mixture of liquid and gas. The liquid is extracted from the space 11 whereas the gas is extracted from the atmosphere on the other side of the openings 50 to the liquid. This creates a gas flow as illustrated by arrows 100 and this gas flow is effective to pin the meniscus 320 between the openings 50 substantially in place as illustrated in FIG. 7. The gas flow helps maintain the liquid confined by momentum blocking, by a gas flow induced pressure gradient and/or by drag (shear) of the gas (e.g., air) flow on the liquid.

The openings 50 surround the space to which the fluid handling structure supplies liquid. The openings 50 may be distributed in an undersurface of the fluid handling structure. The openings 50 may be substantially continuously spaced around the space (although the spacing between adjacent openings 50 may vary). In an embodiment of the present invention liquid is extracted all the way around the cornered shape and is extracted substantially at the point at which it impinges on the cornered shape. This is achieved because the openings 50 are formed all the way around the space (in the cornered shape). In this way the liquid may be confined to the space 11. The meniscus may be pinned by the openings 50, during operation.

As can be seen from FIG. 7, the openings 50 are positioned so as to form, in plan, a cornered shape (i.e. a shape with corners 52). In the case of FIG. 7 this is in the shape of a rhombus, desirably a square, with curved edges or sides 54. The edges 54, if curved, have a negative radius. The edges 54 may curve towards the center of the cornered shape in areas away from the corners 52. An embodiment of the invention may be applied to any shape, in plan, including, but not limited to the shape illustrated, for example, a rectilinear shape, e.g. a rhombus, a square or rectangle, or a circular shape, a triangular shape, a star shape, an elliptical shape, etc.

The cornered shape has principal axes 110, 120 aligned with the major directions of travel of the substrate W under the projection system PS. This helps ensure that, below a critical scan speed, the maximum scan speed is faster than if the openings 50 were arranged in a circular shape. This is because the force on the meniscus between two openings 50 is reduced with a factor cos θ. Here θ is the angle of the line connecting the two openings 50 relative to the direction in which the substrate W is moving.

The use of a square cornered shape allows movement in the step and scanning directions to be at an equal maximum speed. This may be achieved by having each of the corners 52 of the shape aligned with the scanning and stepping directions 110, 120. If movement in one of the directions, for example the scan direction is preferred to be faster than movement in the step direction then a rhombus shape could be used. In such an arrangement the primary axis of the rhombus may be aligned with the scan direction. For a rhombic shape, although each of the corners may be acute, the angle between two adjacent sides of the rhombus, for example in the stepping direction, may be obtuse, i.e. more than 90° (for example selected from the range of about 90° to 120°, in an embodiment selected from the range of about 90° to 105°, in an embodiment selected from the range of about 85° to 105°).

Throughput can be optimized by making the primary axis of the shape of the openings 50 aligned with the major direction of travel of the substrate (usually the scan direction) and to have a second axis aligned with the other major direction of travel of the substrate (usually the step direction). It will be appreciated that any arrangement in which θ is different to 90° will give an advantage in at least one direction of movement. Thus, exact alignment of the principal axes with the major directions of travel is not vital.

An advantage of providing the edges with a negative radius is that the corners may be made sharper. An angle selected from the range of 75 to 85° or even lower may be achievable for both the corners 52 aligned with the scan direction and the corners 52 aligned with the step direction. If it were not for this feature then in order for the corners 52 aligned in both directions to have the same angle, those corners would have to have 90°. If less than 90° were desired it would be necessary to select one direction to have corners with less than 90° with the result that the other corner would have an angle of greater than 90°.

There may be no meniscus pinning features radially inwardly of the openings 50. The meniscus is pinned between the openings 50 with drag forces induced by gas flow into the openings 50. A gas drag velocity of greater than about 15 m/s, desirably about 20 m/s is sufficient. The amount of evaporation of liquid from the substrate may be reduced thereby reducing both splashing of liquid as well as thermal expansion/contraction effects.

In an embodiment, at least thirty-six (36) discrete openings 50 each with a diameter of 1 mm and separated by 3.9 mm may be effective to pin a meniscus. In an embodiment, one hundred and twelve (112) openings 50 are present. The openings 50 may be square, with a length of a side of 0.5 mm, 0.3 mm, 0.2 mm or 0.1 mm. The total gas flow in such a system is of the order of 100 l/min. In an embodiment the total gas flow is selected from the range of 70 l/min to 130 l/min.

Other geometries of the bottom of the fluid handling structure are possible. For example, any of the structures disclosed in U.S. patent application publication no. US 2004-0207824 or U.S. patent application publication no. US 2010/0313974, could be used in an embodiment of the present invention.

As can be seen in FIG. 7, relative to the space 11, one or more slits 61 may be provided outside the openings 50. The slit 61 may be substantially parallel to the lines joining the openings 50. In an embodiment the slit 61 may be a series of discrete apertures provided along a side 54 of the shape. In use, the slit 61 is connected to an over pressure and forms a gas knife (equivalent to gas knife 90 in FIGS. 6 and 10) surrounding the meniscus pinning device formed by openings 50.

The gas knife in an embodiment of the invention functions to reduce the thickness of any liquid film left on a facing surface, such as the substrate W or substrate table WT. The gas knife helps ensure that the liquid film does not break into droplets but rather the liquid is driven towards the openings 50 and extracted. In an embodiment the gas knife operates to prevent the formation of a film. To achieve this, it is desirable that the distance between the center lines of the gas knife and of the meniscus pinning openings 50 is in the range of from 1.5 mm to 4 mm, desirably from 2 mm to 3 mm. The line along which the gas knife is arranged generally follows the line of the openings 50 so that the distance between adjacent ones of the openings 50 and the slit 61 of the gas knife is within the aforementioned ranges. Desirably the line along which the gas knife is arranged is parallel to the line of the openings 50. It is desirable to maintain a constant separation between adjacent ones of the openings 50 and the slit 61 of the gas knife. In an embodiment this is desirable along the length of each center line of the gas knife. In an embodiment the constant separation may be in the region of one of more corners of the liquid handling device.

Localized area fluid handling systems such as those described above, with reference to FIGS. 2-7, can suffer from bubble inclusion into the space 11. As can be seen, a meniscus 320 extends between the fluid handling system 12 and the surface under the fluid handling system 12. This meniscus 320 illustrated in FIGS. 5 and 6 defines the edge of the space 11. When the meniscus 320 and a droplet collide on the surface, for example a droplet of liquid which has escaped the space 11, a bubble of gas may be included into the space 11. Inclusion of a bubble into the space 11 is detrimental because a bubble of gas can lead to an imaging error. A droplet is usually left behind on the surface in one or more of at least three circumstances: (a) when the liquid handling device is located over the edge of a substrate W when there is relative movement between the liquid handling device and the substrate W; (b) when the liquid handling device is located over a step change in height of the facing surface facing the liquid confinement structure when there is relative movement between the liquid handling device and the facing surface; and/or (c) due to too high relative speed between the liquid handling device and the facing surface, for example when the meniscus becomes unstable, e.g. by exceeding the critical scan speed of the facing surface. A bubble may be included at the meniscus 400 illustrated in FIGS. 5 and 6 extending between the liquid confinement structure 12 and the projection system PS. Here a bubble of gas could be created by liquid supplied from a liquid inlet (inlet 13 in FIG. 5 and inlet 20 in FIG. 6) on the radially inward facing surface of the liquid handling system 12 entraining gas from between the projection system PS and the liquid handling device 12.

Ways of dealing with the difficulty of bubble inclusion have concentrated on improving the confinement properties of a liquid confinement structure 12. For example, the relative speed between the liquid confinement structure 12 and the facing surface may be decreased in order to avoid spilling of liquid.

Very small bubbles of gas may dissolve in the immersion liquid before they reach the exposure area of the space 11. An embodiment of the present invention uses the fact that dissolution speed is dependent upon the type of the trapped gas and the immersion liquid properties.

A bubble of carbon dioxide ($CO_2$) typically dissolves faster than a bubble of air. A bubble of $CO_2$ which has a solubility fifty-five (55) times larger than that of nitrogen and a diffusivity of 0.86 times that of nitrogen will typically dissolve in a time thirty-seven (37) times shorter than the time for a bubble of the same size of nitrogen to dissolve.

U.S. patent application publication no. US 2011/0134401, which is hereby incorporated in its entirety by reference, describes supplying a gas with a solubility in the immersion liquid greater than $5 \times 10^{-3}$ mol/kg at 20° C. and 1 atm total pressure to a region adjacent the space 11. It also describes supplying a gas with a diffusivity in the immersion liquid greater than $3 \times 10^{-5}$ cm$^2$ s$^{-1}$ at 20° C. and 1 atm total pressure to a region adjacent the space 11. It also describes supplying a gas with a product of diffusivity and solubility in the immersion liquid of greater than that of air at 20° C. and 1 atm total pressure to a region adjacent the space 11.

If the bubble of gas is of a gas which has a high diffusivity, solubility or product of diffusivity and solubility in the immersion liquid, it will dissolve into the immersion liquid much faster. Therefore, using an embodiment of the invention will reduce the number of imaging defects thereby allowing higher throughput (e.g., higher speed of the substrate W relative to the liquid handling system 12) and lower defectivity.

Therefore, an embodiment of the present invention provides a gas supplying device configured to supply gas to a region (e.g. to a volume, or a towards an area) adjacent the space 11. In particular, gas is provided such that it is present in the region adjacent to the meniscus 320 extending between the facing surface and the liquid handling device.

Gases which are suitable are, for example, those with solubilities (mass of gas per unit mass of immersion liquid at a total pressure of 1 atm (sum of the partial pressures of gas and immersion liquid)) in the immersion liquid (for example, water) of greater than $1 \times 10^{-3}$ at 20° C. and 1 atm total pressure. Volume of gas rather than weight of gas may be more important because a certain volume of gas rather than weight is needed to fill the region adjacent the space. Therefore, the solubility may be better expressed in mols of gas per kg of liquid (i.e. in mol/kg). In that case the solubility should be greater than $5 \times 10^{-3}$ mol/kg, desirably greater than $10 \times 10^{-3}$ mol/kg, greater than $15 \times 10^{-3}$ mol/kg, greater than $20 \times 10^{-3}$ mol/kg or greater than $25 \times 10^{-3}$ mol/kg.

Gases which are suitable are, for example, those with diffusivities of greater than $3 \times 10^{-5}$ cm$^2$s$^{-1}$ at 20° and 1 atm total pressure. This compares to that of air which is $2.3 \times 10^{-5}$ cm$^2$ s$^{-1}$. Desirably the diffusivity is greater than $8 \times 10^{-5}$, greater than $1 \times 10^{-4}$, or greater than $5 \times 10^{-4}$ cm$^2$ s$^{-1}$. Most gasses have a diffusivity of between $1-2 \times 10^{-5}$ cm$^2$ s$^{-1}$. Both oxygen and nitrogen have a diffusivity of $2.3 \times 10^{-5}$ cm$^2$ s$^{-1}$ and carbon dioxide is $1.6 \times 10^{-5}$ cm$^2$ s$^{-1}$. Helium has a diffusivity of $3.8 \times 10^{-5}$ cm$^2$ s$^{-1}$ (and a solubility of $1.6 \times 10^{-6}$ kg/kg or $4 \times 10^{-4}$ mol/kg). Hydrogen has a diffusivity of $5.8 \times 10^{-5}$ cm$^2$ s$^1$ (and a solubility of $1.6 \times 10^{-6}$ kg/kg or $8 \times 10^{-4}$ mol/kg).

Particularly desirable are gases with solubilities of greater than $1 \times 10^{-3}$ kg/kg or greater than $3 \times 10^{-3}$ mol/kg, at 20° C. and 1 atm total pressure and/or diffusivities in the immersion liquid of greater than $3 \times 10^{-5}$ cm$^2$ s$^{-1}$ at 20° C. and 1 atm pressure. In an embodiment the gas is a gas which has a product of diffusivity and solubility greater than that of air. For example, the product of diffusivity and solubility should be greater than $1 \times 10^{-9}$ cm$^2$ s$^{-1}$ (using a mass ratio for the solubility) or greater than $2 \times 10^{-8}$ mol cm$^2$ s$^{-1}$ kg$^{-1}$ (using mol/kg for solubility). Desirably the product of solubility and diffusivity is greater than $5 \times 10^{-9}$, greater than $1 \times 10^{-8}$ or greater than $3 \times 10^{-8}$ cm$^2$ s$^{-1}$ (using a mass ratio for the solubility) or greater than $4 \times 10^{-8}$, greater than $10 \times 10^{-8}$, greater than $20 \times 10^{-8}$, greater than $40 \times 10^{-8}$ or greater than $50 \times 10^{-8}$ cm$^2$ s$^{-1}$ mol kg$^{-1}$ (using mol/kg for solubility). An example gas is carbon dioxide.

In an embodiment, gases with a product of solubility and diffusivity greater than that of air (at 20° C. and 1 atm total pressure) are used. The solubility may be measured in kg/kg or in mol/kg. Gases with those properties will dissolve in the immersion liquid faster than air thereby allowing a higher scan speed to be used without risk of bubbles included at the meniscus 320, 400 from still being present in the exposure area at exposure time.

An example gas is carbon dioxide which may be desirable because it is readily available and may be used in immersion systems for other purposes. Carbon dioxide has solubility in water at 20° C. and 1 atm total pressure of $1.69 \times 10^{-3}$ kg/kg or $37 \times 10^{-3}$ mol/kg. Other suitable gases may be chlorine ($7.0 \times 10^{-3}$ kg/kg or $98 \times 10^{-3}$ mol/kg), hydrogen sulphide ($3.85 \times 10^{-3}$ kg/kg or $113 \times 10^{-3}$ mol/kg), hydrogen chloride (0.721 kg/kg or $19753 \times 10^{-3}$ mol/kg), ammonia (0.531 kg/kg or $31235 \times 10^{-3}$ mol/kg) or sulphur dioxide (0.113 kg/kg or $1765 \times 10^{-3}$ mol/kg). Some of those gases may have one or more disadvantages. For example, some of those gases may react with components in the immersion lithographic apparatus and/or may be poisonous and may therefore be harder to handle and less desirable than carbon dioxide. Any non-reactive gas which readily dissolves in immersion liquid is suitable.

An embodiment of the present invention herein described may form a $CO_2$ atmosphere around the meniscus 320 of immersion liquid so that any inclusion of gas into the immersion liquid creates a gas inclusion which dissolves in the immersion liquid. An embodiment of the present invention will be described below with reference to the soluble gas being carbon dioxide, though the soluble gas could be any gas, as described above.

By using gaseous $CO_2$ the problem associated with the meniscus 320 colliding with a droplet of liquid may be reduced if not alleviated. Typically a droplet of 300 micrometers would produce a bubble of 30 micrometers in diameter (i.e. a tenth the size). Such a bubble of carbon dioxide would usually dissolve in the immersion liquid before reaching the exposure area. (Note that a droplet of such a size may cause one or more other problems). Therefore the problems caused by a droplet would be less significant. The immersion system would be more tolerant of interacting with immersion liquid which had escaped from the space.

Carbon dioxide can be provided through a gas supply opening 210. The gas supply opening 210 may be radially outward of meniscus pinning features such as the extractor 70 in FIG. 6 or the outlets 50 in FIG. 7.

Figure 8:
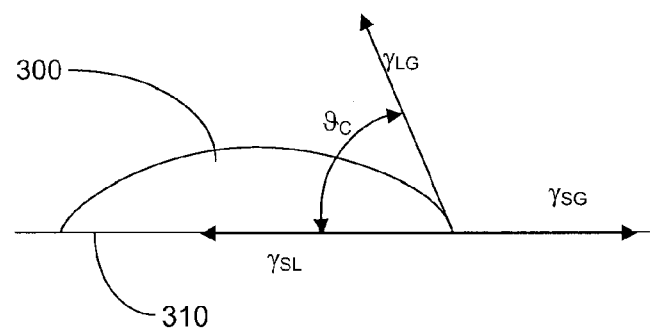
FIG. 8 illustrates, in cross-section, the forces acting on a droplet on a surface which result in a particular contact angle.

Another advantage of providing carbon dioxide through the gas supply opening 210 is that the carbon dioxide may then dissolve in immersion liquid at the meniscus 320 under the meniscus pinning openings 50. This results in the immersion liquid at the meniscus 320 becoming slightly acidic (a decrease in pH). If the immersion liquid becomes more acidic this increases the presence of $H_3O^+$ ions. An increase in the number of $H_3O^+$ ions results in the solid-liquid surface energy ($\gamma_{SL}$) decreasing. The solid-gas surface energy ($\gamma_{SG}$) does not change and neither does the liquid-gas surface energy ($\gamma_{LG}$). The change in the solid-liquid surface energy therefore affects the equilibrium between the three surface energies. The surface tension in the liquid meniscus especially towards its interface with the solid surface is affected. The change in direction of the surface tension as a consequence of the change in the surface engeries is illustrated in FIG. 8. FIG. 8 shows the contact angle $\theta_C$ of the droplet 300 on the surface 310. The relationship between the three surface energies and the contact angle is given in the following equation:

$$\gamma_{LG} \cos \theta_C = \gamma_{SG} - \gamma_{SL}$$

According to this equation a decrease in the solid-liquid electrical surface energy ($\gamma_{SL}$) results in an increase in the contact angle $\theta_C$. An increase in the contact angle $\theta_C$ between liquid and the facing surface, particularly at the meniscus 320, results in an improvement in performance of the liquid pinning feature (e.g. meniscus pinning openings 50). A higher velocity between the fluid handling system and facing surface may be achieved before liquid is lost from the immersion space, beyond the meniscus pinning feature.

Figure 9:
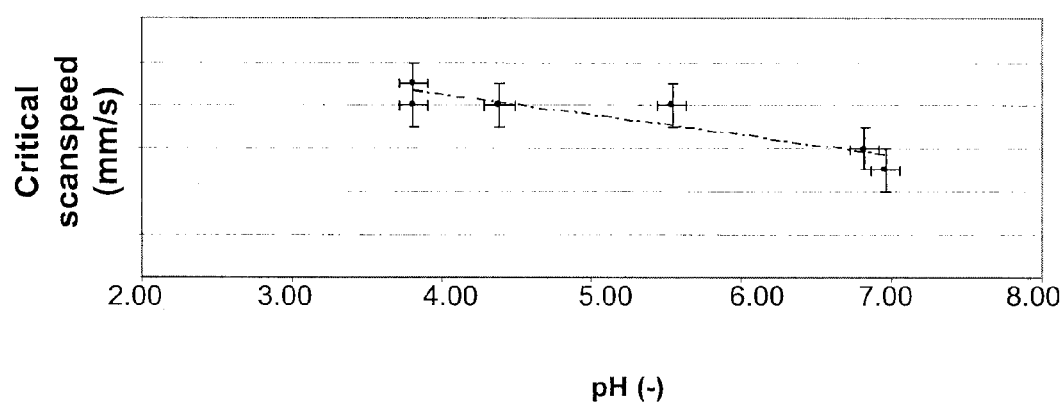
FIG. 9 is a graph of critical scan speed versus pH of immersion liquid.

FIG. 9 is a graph showing the pH of immersion liquid along the x axis and the critical scanning speed before liquid loss along the y axis. The graph is for a particular type of fluid handling system and a substrate having a top coat of TCX041 available from JSR Micro, Inc. in Calif., US.

FIG. 9 shows that a reduction in pH of immersion liquid leads to an increase in critical scan speed. An increase in critical scan speed would lead to an increase in throughput as a high scan speed can be used without risk of significant liquid loss (which can lead to imaging errors as described above). This is particularly so for larger substrates such as substrates with a diameter of 450 mm. This is because on such a substrate, relative to a smaller substrate, more scans are performed a distance away from the edge of the substrate, for example in a region towards the center of the substrate. It is the scans in a region towards the center of the substrate which can be performed close to critical scan speed; whereas scans performed closer to the edge of a substrate may need to be performed at a slower speed than the critical scan speed. The reason for this difference in scan speed can be, for example, the effect of the edge of the substrate on the stability of the meniscus 320.

In an embodiment the immersion liquid at the meniscus 320 is saturated with carbon dioxide (which achieves a pH of just below 4). This results in the highest contact angle and thereby the theoretical fastest critical scan speed. However, one or more of the advantages described above relating to the inclusion of bubbles in the immersion liquid would not be achieved at saturation. This is because such carbon dioxide included in the immersion liquid could not dissolve (because the immersion liquid is saturated). Therefore, in an embodiment, particularly an embodiment in which the fluid handling system comprises a gas knife using carbon dioxide radially outwardly of the meniscus pinning feature, a lower level of carbon dioxide in immersion liquid, for example resulting in a pH of between 5 and 6, is desirable. If the gas knife uses a gas other than carbon dioxide, the immersion liquid may be saturated, as described above.

In an embodiment the gas supplied is not carbon dioxide. Gases other than carbon dioxide could be used to dissolve in the immersion liquid and turn it acidic such as $SO_2$, HCl, and/or —COOH. Such a gas is soluble in the immersion liquid at least to some extent. Such a gas changes the pH of the immersion liquid. An increase in pH beyond 7 (neutral) would result in a decrease in the number of $H_3O^+$ ions and therefore a decrease in the solid-liquid surface energy ($\gamma_{SL}$).

This is because the electrochemical potential is proportional to the square root of the concentration of ions. Examples of gases which when dissolved in immersion liquid make the immersion liquid more alkaline are ammonia and $CH_3NH_2$. Dissociating compounds such as $CH_3F$, $CH_3Cl$ and salts may have the same effect of decreasing the solid-liquid surface energy ($\gamma_{SL}$).

In an embodiment the immersion liquid provided may be acidic or alkali, irrespective of the type of fluid handling structure. The idea of providing an acidic immersion liquid has previously been described in EP 1,482,372, herein by incorporated in its entirety by reference, in connection with reducing interaction of immersion liquid with top coat. However, this document does not appreciate the possibility of increasing scan speed as a result of the acidic immersion liquid. In an embodiment normal (e.g. neutral) immersion liquid may be used and acidic or alkaline immersion liquid may be provided through a liquid supply opening in the undersurface of the fluid handling structure radially inwardly of the meniscus pinning features. An example of a liquid supply opening is the opening 180 illustrated in FIG. 6. A similar opening may be present in any of the other embodiments described herein.

A difficulty with providing carbon dioxide in a lithographic apparatus is that some components, for example components of a position measurement system of the substrate table, may have impared performance in a carbon dioxide atmosphere. In an embodiment it is ensured that a pure carbon dioxide environment is present near the meniscus 320 during scanning. To achieve this, it may be necessary, for example in the embodiment of FIG. 7, to have a flow rate of carbon dioxide out of the outlet 210 greater than the extraction through the openings 50. This may result in an excess of carbon dioxide leaking out from under the fluid handling system 12 into the environment of the machine and particularly towards components of a position measurement system of the substrate table WT.

In an embodiment of the invention, in order to help ensure that excess carbon dioxide does not leak from under the fluid handling structure 12, at least one gas recovery opening 220 is provided radially outward of the one or more meniscus pinning features 50, 70. In this way an environment of carbon dioxide can still be provided radially outwardly of the meniscus pinning features thereby helping achieve reduced bubble inclusion in the space 11. Also, possible contamination or interruption of functioning of components of the lithographic apparatus can be prevented or reduced.

In an embodiment the at least one gas recovery opening 220 is provided radially outward of the gas supply opening 210. However, this is not necessarily the case. For example, in the embodiment of FIG. 10 described below, the at least one gas recovery opening 220 is provided radially inwardly of the gas supply opening 210.

The gas supply opening 210 and/or gas recovery opening 220 may be provided as a single slit or a plurality of discrete openings.

In an embodiment the gas recovery opening 220 at least partly surrounds the gas supply opening 210. It may not be possible for the gas recovery opening 220 to completely surround the gas supply opening 210. For example, in the embodiment of FIG. 12, there may be components leading to the fluid handling structure 12 which mean that a thermal cover 300 does not completely surround the fluid handling structure 12 and thereby the gas recovery opening 220 does not completely surround the fluid handling structure 12. In an embodiment the gas recovery opening 220 surrounds the majority of the perimeter of the gas supply opening 210. In an embodiment the gas recover opening 220 may surround at least half of the perimeter. That is, in an embodiment, the gas recovery opening 220 may substantially completely surround the perimeter of the gas supply opening 210. A high extraction rate out of the gas recovery opening 220 (for example connecting a large under pressure source to the gas recovery opening 220) at least partly mitigates for the fact that the at least one gas recovery opening 220 does not completely surround the gas supply opening 210.

In the embodiment of FIG. 6 the at least one gas recovery opening 220 is formed in the fluid handling structure 12. In an embodiment the at least one gas recovery opening 220 is formed in an undersurface of the fluid handling structure 12. In an embodiment the at least one gas recovery opening 220 is formed in a bottom surface of the fluid handling structure 12. In an embodiment, the gas recovery opening 220 is formed in the same surface in which the gas supply opening 210 and meniscus pinning feature 70 is formed. Radially outwardly of the gas supply opening 210 and gas recovery opening 220 is the gas knife 90. The flow of gas out of the gas supply opening 210 is both radially inward towards the meniscus 320 and radially outward.

In an embodiment the radially outward flow is greater than the inward flow. This helps ensure that there is no flow of gas radially inward from outside the fluid handling structure 12. If the radially outward flow from the gas supply opening 210 is too low, this could have the effect of sucking in gas from the outside of the fluid handling structure 12.

Figure 11:
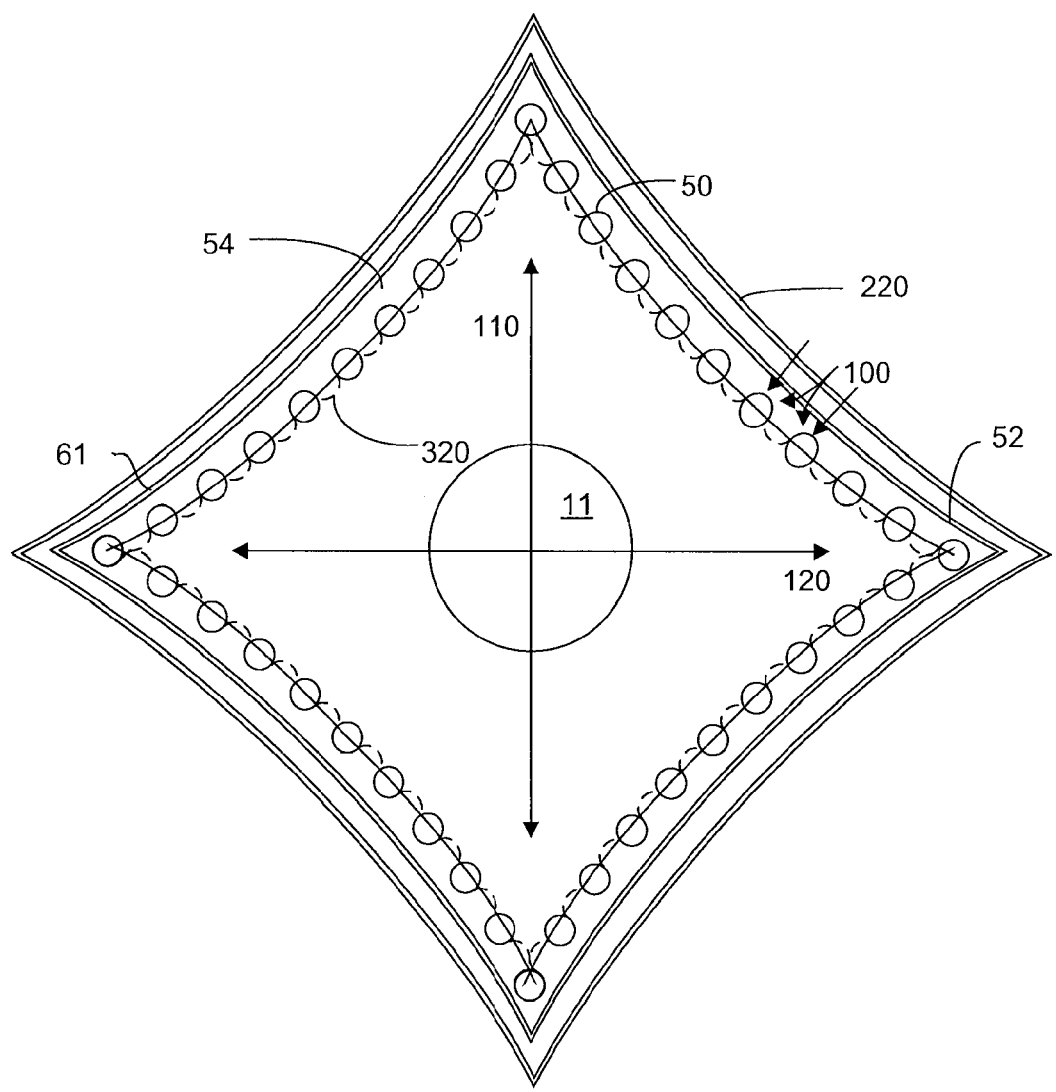
FIG. 11 depicts, in plan, a liquid supply system for use in a lithographic projection apparatus.

In an embodiment the gas knife 90 is not present. A gas knife provides a flow of gas which results in a pressure peak on the facing surface (e.g. substrate). Sometimes it is desired not to have a force from a gas knife on the substrate W. In this case, a shield of a gas with a high solubility in the immersion liquid can be used on its own. In the embodiment of FIG. 11 the carbon dioxide is provided through the gas knife itself, as described below.

The embodiment of FIG. 6 is particularly suited for use with low flow rates of carbon dioxide. The area radially outward of the meniscus 320 between the fluid handling structure 12 and the facing surface (e.g. substrate W) has a slight overpressure of carbon dioxide in it compared to atmospheric pressure. This helps prevent mixing with gas from outside of the fluid handling structure 12 and helps prevent carbon dioxide leaking into the environment.

The embodiment of FIG. 7 is the same as that of FIG. 6 concerning the gas supply opening 210 and the gas recovery opening 220. A higher flow rate of carbon dioxide out of the gas supply opening 210 will be optimal in the embodiment of FIG. 7. This is because of the high flow rate of gas into the openings 50.

Figure 10:
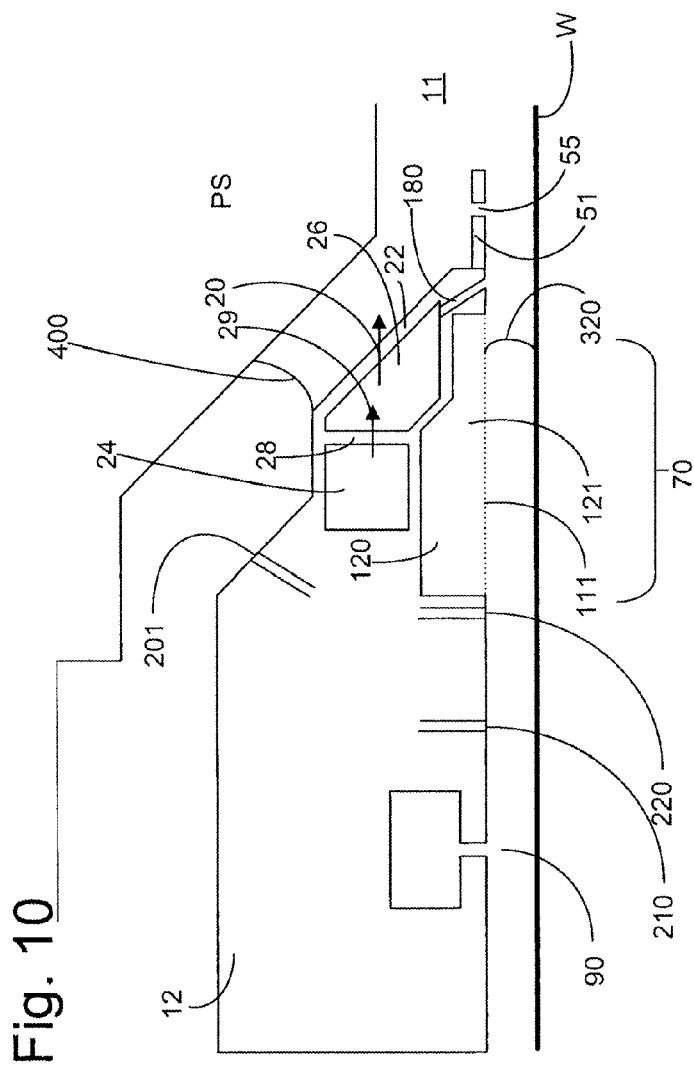
FIG. 10 depicts, in cross-section, a further liquid supply system for use in a lithographic projection apparatus.

The embodiment of FIG. 10 is the same as the embodiment of FIG. 6 except described below. In the embodiment of FIG. 10 the at least one gas recovery opening 220 is radially outward of the meniscus pinning feature 70 and radially inward of the gas supply opening 210. The gas supply opening 210 is radially outward of the at least one gas recovery opening 220. The gas supply opening 210 is radially inward of the gas knife 90, in the case that the gas knife is present. The gas knife 90 is not required in the embodiment of FIG. 10 (or FIG. 6) and is an optional feature.

In the embodiment of FIG. 10 a zone of carbon dioxide overpressure is positioned between the fluid handling structure 12 and the facing surface (e.g. substrate W) and radially inward of the gas supply opening 210. The at least one gas recovery opening 220 can be seen at least partly to surround the gas supply opening 210 on the inner side.

The embodiment of FIG. 11 is the same as the embodiment of FIG. 7 except as described below. In the embodiment of FIG. 11 the gas knife opening 61 is attached to a supply of carbon dioxide. Thereby the function of the gas supply opening 210 of FIG. 7 is taken over by the opening 61 of the gas knife 61.

The at least one gas recovery opening 220 is positioned radially outward of the openings 50 as well as the opening 61 of the gas knife. Thereby the function of the gas knife is the same as in the case where no gas supply opening 210 is provided. However, because the gas exiting the opening 61 of the gas knife is carbon dioxide, an advantage described in U.S. patent application publication no. US 2011/0134401 of using a gas with a high solubility in immersion liquid is achieved.

Because the gas exiting the opening 61 of the gas knife is carbon dioxide, that gas has a higher kinetic energy than gas comprising air at the same velocity. This is because the density of carbon dioxide is higher than that of air. As a result, a thinner film thickness of liquid can be achieved under the gas knife for a given flow volume.

The escape of carbon dioxide into the environment of the lithographic apparatus is reduced by collecting the carbon dioxide radially outwardly of the opening 61 of the gas knife through the gas recovery opening 220.

Figure 12:
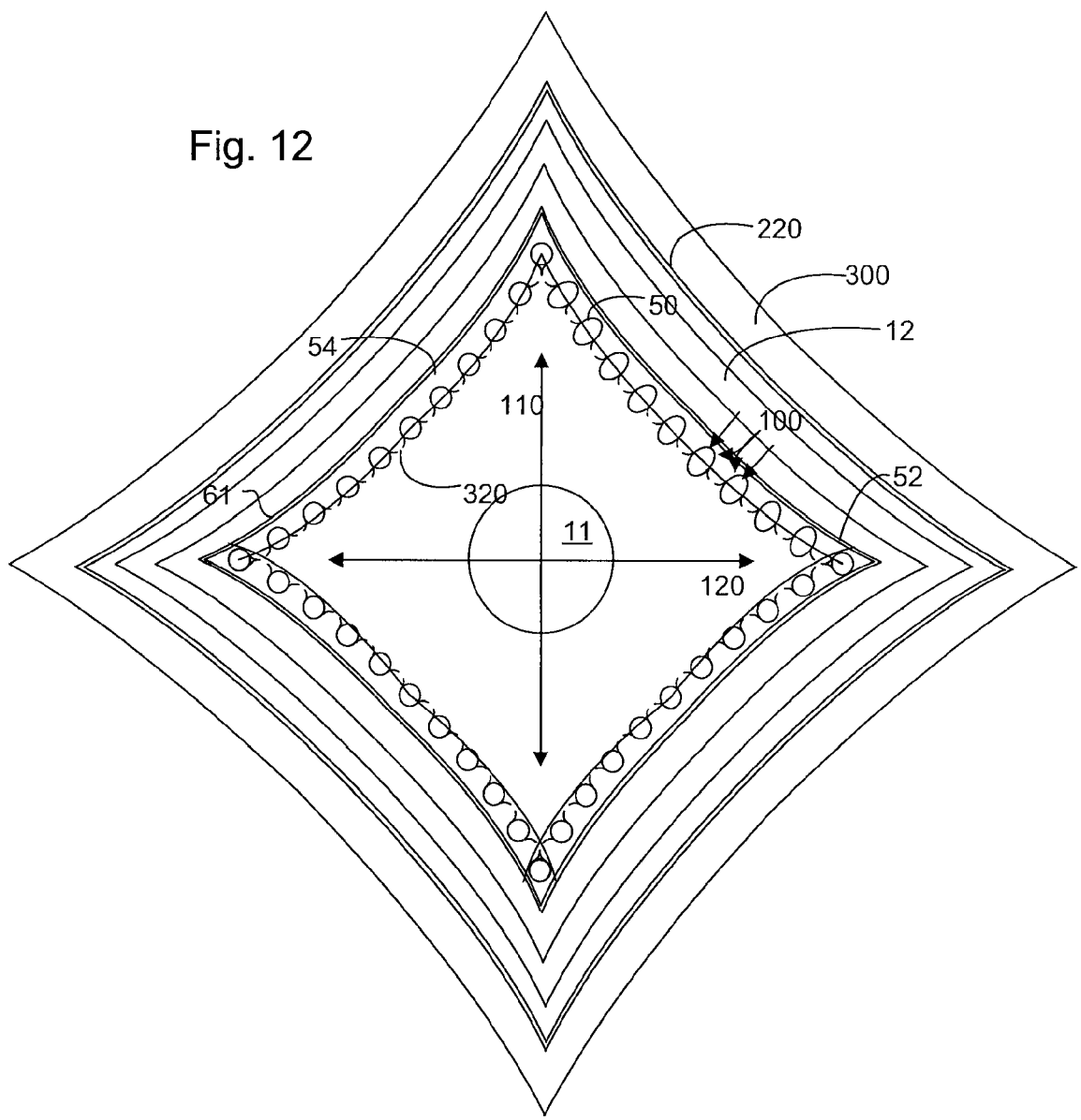
FIG. 12 depicts, in plan, a liquid supply system and thermal cover for use in a lithographic projection apparatus.

In all of the embodiments of FIGS. 6, 7, 10 and 11 the at least one gas recovery opening 220 is provided in the fluid handling structure 12 itself. In the FIG. 12 embodiment the at least one gas recovery opening 220 is provided in a separate component. The embodiment of FIG. 12 is the same as the embodiment of FIG. 11 except as described below. In the embodiment of FIG. 12 the fluid handling structure 12 is surrounded by a thermal cover 300. The thermal cover 300 insulates the final optical element of the projection system PS and/or components of a substrate table WT position measurement apparatus from thermal load resulting from the fluid handling structure 12. Space on the fluid handling structure 12 is limited. Therefore, it may be more convenient to provide the at least one gas recovery opening 220 in the thermal cover 300 as is illustrated in FIG. 12. Therefore, although carbon dioxide may exit the opening 61 of the gas knife and find its way out from under the fluid handling structure 12, this gas is recovered through the at least one gas recovery opening 220 in the thermal cover 300. The at least one gas supply opening 220 may be in an undersurface of the thermal cover 300.

Figure 13:
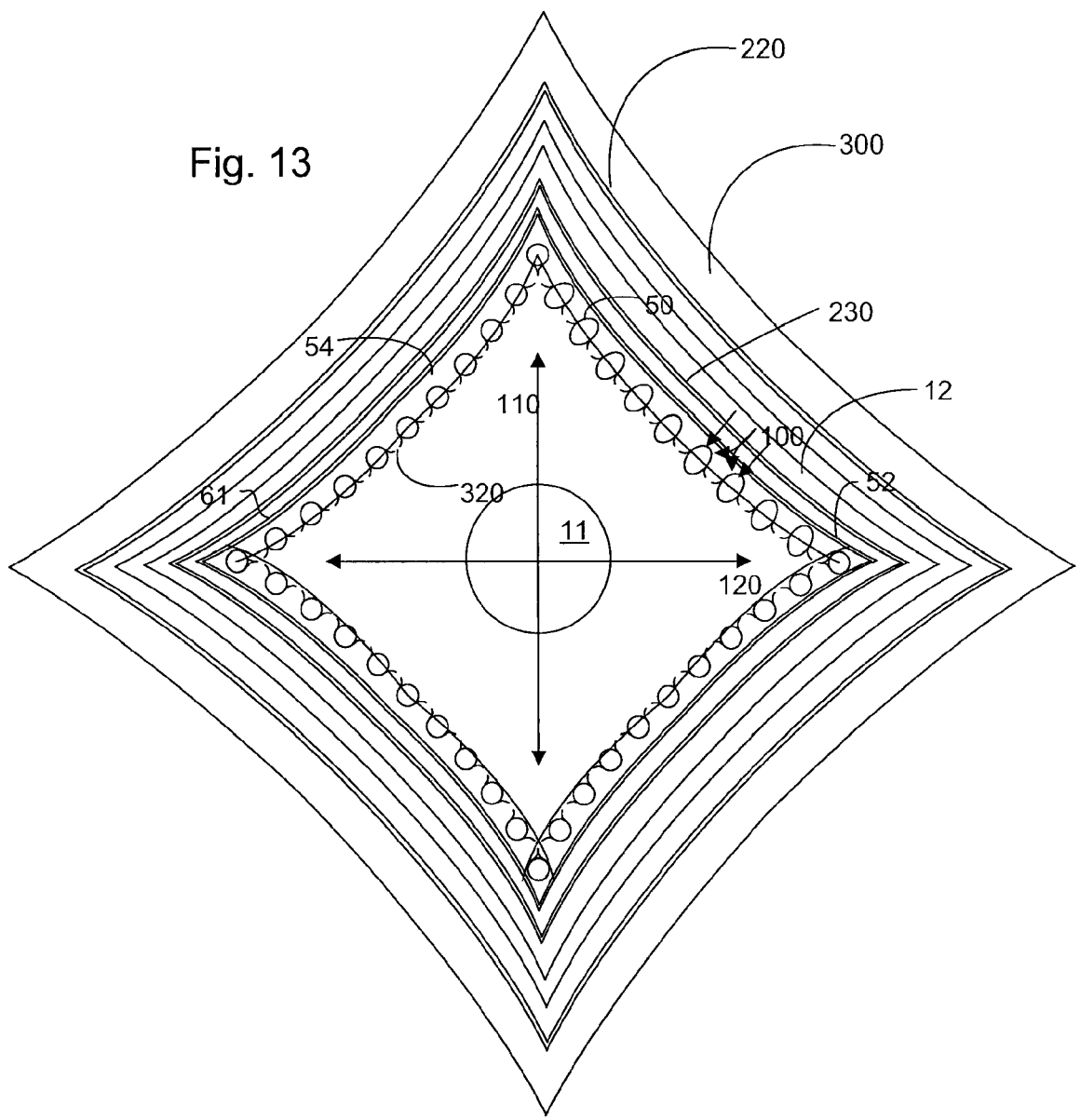
FIG. 13 depicts, in plan, a liquid supply system and thermal cover for use in a lithographic projection apparatus.

The embodiment of FIG. 13 is the same as that of FIG. 12 except as described below. In U.S. patent application publication no. US 2011/0134401, the idea of supplying a fluid soluble in the immersion liquid which on dissolution into the immersion fluid lowers the surface tension of the immersion fluid is disclosed.

U.S. patent application publication no. US 2011/0134401 describes that droplets with a lower height, on collision with the meniscus 320, are less likely to cause bubble inclusion than droplets which are higher. Therefore, provision of a fluid soluble in immersion liquid and capable of lowering the surface tension of a meniscus of a body of immersion liquid outside of the space reduces the chance of droplet collision with the meniscus 320 leading to lower bubble inclusion in the space. One or more further advantages may result from this. For example, the flow rate of gas out of a gas knife may be reduced because the disadvantage of loss of immersion liquid is reduced. A local thermal load which may occur due to evaporation of a droplet, and which may result in mechanical deformation and/or a drying stain on the facing surface, may be reduced because the droplet is spread out as its surface tension is reduced. This spreading out results in a thermal load which is less localized.

In an embodiment, it is possible to help ensure that a film of liquid (rather than discrete droplets) is left behind on the substrate W after it passes under the fluid handling structure 12. When a liquid film is left behind on the substrate W, the film is less likely to break up into droplets because of the lowered surface tension of the meniscus of the immersion liquid. A liquid film may be desirable because this reduces the total number of collisions between liquid on the substrate and the meniscus 320 thereby reducing the number of collisions which can lead to bubble formation. That is, a reduction in surface tension increases the time which a film of liquid takes to break up into a plurality of droplets. Additionally, any thermal load due to evaporation is applied to the facing surface evenly. Therefore, in the embodiment of FIG. 13, a fluid supply opening 230 is provided radially outward of the opening 61 of the gas knife (or in the case of a separate gas supply opening 210, of the gas supply opening 210). The gas knife (or in the case of a separate gas supply opening 210, the gas supply opening 210) provides the shielding device referred to in U.S. patent application publication no. US 2011/0134401.

The fluid soluble in the immersion liquid and for lowering the surface tension of the meniscus of the immersion liquid can be any fluid which achieves the function of reducing the surface tension of the meniscus of the immersion liquid. In order to achieve this, the fluid should be soluble at least to some extent in the immersion liquid. Desirably the fluid has a solubility of greater than 10% in the immersion liquid. In an embodiment the fluid has a solubility of greater than 15, 20, 30 or even 40% in the immersion liquid. The fluid desirably has a lower surface tension than water. The fluid has a relatively high vapor pressure at operating temperature to ensure sufficient supply. The uptake of the vapor of the soluble fluid in the liquid should be sufficiently fast. Suitable classes of chemicals are alcohols, ketones (for example acetone), aldehydes (for example formaldehyde), organic acids (for example acetic and formic acid), and/or esters and amines (including ammonia). In general a chemical with a lower molecular weight (which generally gives higher vapor pressure and liquid solubility) are desirable. Desirably the soluble fluid has fewer than 10 carbon atoms per molecule, desirably fewer than 8, 6, 5, 4, 3 or even 2 carbon atoms per molecule. One example of the fluid is IPA (isopropyl alcohol). Another example of the fluid is ethanol. In an embodiment, the soluble fluid is a liquid with molecules which undergo hydrogen bonding; IPA and ethanol also have relatively high vapor pressures (i.e. small molecules).

The fluid may be provided through the fluid supply opening 230 in any form, as described in U.S. patent application publication no. US 2011/0134401. In particular, the fluid may be provided as a vapor, as a pure gas or a mixture of gases, or as a spray of droplets.

An advantage of the embodiment of FIG. 13 is that the potential danger of providing an explosive vapor or liquid is reduced by the presence of carbon dioxide.

Figure 14:
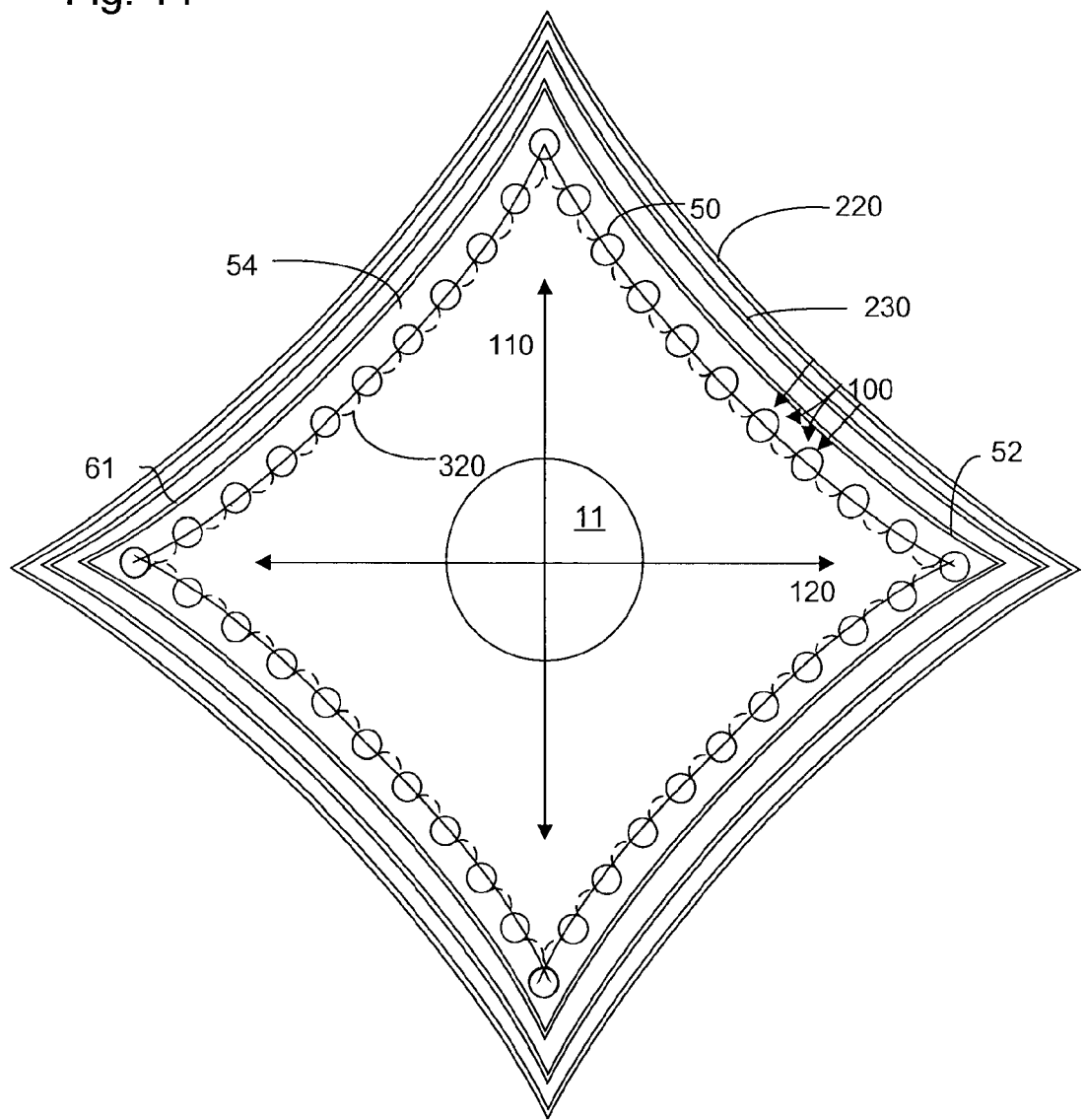
FIG. 14 depicts, in plan, a liquid supply system for use in a lithographic projection apparatus.

The embodiment of FIG. 14 is the same as that of FIG. 11 except as described below. In the embodiment of FIG. 14 a fluid supply opening 230 such as that described above with respect to FIG. 13 is provided. The fluid supply opening 230 is positioned between the opening 61 of the gas knife and the at least one gas recovery opening 220.

The fluid supply opening 230 may be used in any embodiment. A fluid supply opening 230 may be provided between the gas supply opening 210 and the at least one gas recovery opening 220 of any one of FIG. 6, 7 or 10 or as in the case of FIGS. 13 and 14 between the opening 61 of the gas knife and the at least one gas recovery opening 220.

In an embodiment a module for an immersion lithographic apparatus is provided. The module comprises a fluid handling structure 12 of any of the above embodiments and a gas supplying device 212 (illustrated in FIG. 1) configured to supply gas to the gas supply opening 210. The gas supplied by the gas supplying device is a gas with, for example, a solubility in the immersion liquid of greater than $5 \times 10^{-3}$ mol/kg at 20° C. and 1 atm total pressure to a region adjacent the space 11.

In an embodiment the module comprises an under pressure source 222 (illustrated in FIG. 1) connectable to the at least one gas recovery opening 220.

In an embodiment the module comprises a soluble fluid source 232 (illustrated in FIG. 1) of a fluid soluble in the immersion fluid and which upon dissolution in the immersion fluid lowers the surface tension of a meniscus 320 of immersion fluid and for being provided to the fluid supply opening 230.

As will be appreciated, any of the above described features can be used with any other feature and it is not only those combinations explicitly described which are covered in this application. For example, an embodiment of the invention could be applied to the embodiments of FIGS. 2 to 4.

In a first aspect, the present invention relates to a fluid handling structure for a lithographic apparatus, the fluid handling structure having, at a boundary from a space configured to contain immersion fluid to a region external to the fluid handling structure: one or more meniscus pinning features for resisting the passage of immersion fluid in a radially outward direction from the space; at least one gas supply opening radially outward of the one or more meniscus pinning features; and at least one gas recovery opening radially outward of the one or more meniscus pinning features and at least partly surrounding the at least one gas supply opening.

In a second aspect the at least one gas recovery opening of the first aspect surrounds the majority of the perimeter of the at least one gas supply opening.

In a third aspect the first or second aspect further comprises at least one gas knife opening radially outward of the at least one gas recovery opening.

In a fourth aspect the at least one gas supply opening of the first or second aspect is an opening of a gas knife.

In a fifth aspect any preceding aspect further comprises at least one fluid supply opening.

In a sixth aspect the at least one fluid supply opening of the fifth aspect is radially outward of the at least one gas supply opening.

In a seventh aspect the at least one fluid supply opening of the fifth or sixth aspect is radially inwardly of the at least one gas recovery opening.

In an eighth aspect the one or more meniscus pinning features of any preceding aspect comprises a plurality of openings in a line.

In a ninth aspect the one or more meniscus pinning features of any of the first to seventh aspects comprises a single phase extractor.

In a tenth aspect the at least one gas recovery opening of any of the preceding aspects is radially outward of the at least one gas supply opening.

In an eleventh aspect the at least one gas recovery opening of any of the preceding aspects is radially inward of the at least one gas supply opening.

In a twelfth aspect the at least one gas supply opening and/or the at least one gas recovery opening of any preceding aspect are in an undersurface of the fluid handling structure.

In a thirteenth aspect the at least one gas supply opening and gas recovery opening of any preceding aspect are formed in the same surface of the fluid handling structure.

The fourteenth aspect relates to a module for an immersion lithographic apparatus, the module comprising: the fluid handling structure according to any of the preceding aspects.

In a fifteenth aspect the module of the fourteenth aspect further comprises a gas supplying device configured to supply to the at least one gas supply opening a gas with a solubility in the immersion liquid of greater than $5 \times 10^{-3}$ mol/kg at 20° C. and 1 atm total pressure to a region adjacent the space.

In a sixteenth aspect the module of the fourteenth or fifteenth aspect further comprises a gas supplying device configured to supply to the at least one gas supply opening a gas which reduces the pH of the immersion liquid when dissolved in the immersion liquid.

In a seventeenth aspect the fourteenth, fifteenth or sixteenth aspect further comprises an under pressure source connectable to the at least one gas recovery opening.

In an eighteenth aspect any of the fourteenth to seventeenth aspects further comprise a soluble fluid source of a fluid soluble in the immersion fluid and which soluble fluid upon dissolution in the immersion fluid lowers the surface tension of a meniscus of the immersion fluid, the source being fluidly connected to the at least one fluid supply opening.

A nineteenth aspect relates to an immersion lithographic apparatus, the apparatus comprising: the fluid handling structure according to any of the first to thirteenth aspects and/or the module according to any of the fourteenth to eighteenth aspects.

A twentieth aspect relates to a fluid handling structure for a lithographic apparatus, the fluid handling structure successively having, at a boundary from a space configured to contain immersion fluid to a region external to the fluid handling structure: one or more meniscus pinning features for resisting the passage of immersion fluid in a radially outward direction from the space; at least one gas recovery opening radially outward of the one or more meniscus pinning features; and at least one gas supply opening radially outward of the at least one gas recovery opening.

In a twenty first aspect the one or more meniscus pinning features of the twentieth aspect comprises a single phase extractor.

In a twenty second aspect the twentieth or twenty first aspect further comprises at least one fluid supply opening radially outwardly of the at least one gas recovery opening.

A twenty third aspect relates to a fluid handling structure for a lithographic apparatus, the fluid handling structure successively having, at a boundary from a space configured to contain immersion fluid to a region external to the fluid handling structure: one or more meniscus pinning features for resisting the passage of immersion fluid in a radially outward direction from the space: at least one gas supply opening radially outward of the one or more pinning features; and at least one fluid supply opening radially outward of the at least one gas supply opening for supplying a soluble fluid soluble in the immersion fluid which on dissolution into the immersion fluid lowers the surface tension of the immersion fluid.

In a twenty fourth aspect the twenty third aspect further comprises at least one gas recovery opening radially outward of the at least one fluid supply opening and at least partly surrounding the at least one fluid supply opening.

A twenty fifth aspect relates to a lithographic apparatus comprising a fluid handling structure and a thermal cover for thermally shielding components from the fluid handling system; wherein the fluid handling structure has, at a boundary from a space configured to contain immersion fluid to a region external to the fluid handling structure: one or more meniscus pinning features for resisting the passage of immersion fluid in a radially outward direction from the space; and at least one gas supply opening radially outward of the one or more pinning features; wherein the thermal cover comprises at least one gas recovery opening radially outward of the one or more pinning features and at least partly surrounding the at least one gas supply opening.

In a twenty sixth aspect the twenty fifth aspect further comprises at least one fluid supply opening radially outward of the one or more pinning features for supplying a soluble fluid soluble in the immersion fluid which on dissolution into the immersion fluid lowers the surface tension of the immersion fluid.

A twenty seventh aspect relates to a device manufacturing method, comprising: projecting a patterned beam of radiation through an immersion liquid confined to a space between a final element of projection system and a substrate and providing gas through an opening to a position adjacent a meniscus of the immersion liquid; and recovering gas from the opening through a gas recovery opening.

In a twenty eighth aspect wherein the gas of the twenty seventh aspect has a solubility in the immersion liquid of greater than $5 \times 10^{-3}$ mol/kg at 20° C. and 1 atm total pressure to a region adjacent the space.

A twenty ninth aspect relates to a device manufacturing method, comprising: projecting a patterned beam of radiation through an immersion liquid confined to a space between a final element of projection system and a substrate and providing gas through an opening to a position adjacent a meniscus of the immersion liquid; and providing a fluid soluble in the immersion fluid and which upon dissolution in the immersion fluid lowers the surface tension of a meniscus of the immersion fluid and for being provided to the fluid supply opening at a position radially outward of the position at which the gas is provided.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A fluid handling structure for a lithographic apparatus, the fluid handling structure having, at a boundary from a space configured to contain immersion fluid to a region external to the fluid handling structure:
    a meniscus pinning feature to resist passage of immersion fluid in a radially outward direction from the space;

a gas supply opening radially outward of the meniscus pinning feature, to supply a soluble fluid soluble in the immersion fluid which soluble fluid on dissolution into the immersion fluid lowers the surface tension of the immersion fluid; and a gas recovery opening radially outward of the meniscus pinning feature and at least partly surrounding the gas supply opening.

2. The fluid handling structure of claim 1, wherein the gas recovery opening surrounds the majority of the perimeter of the gas supply opening.

3. The fluid handling structure of claim 1, further comprising a gas knife opening radially outward of the gas recovery opening.

4. The fluid handling structure of claim 1, wherein the gas supply opening is an opening of a gas knife.

5. The fluid handling structure of claim 1, further comprising a fluid supply opening.

6. The fluid handling structure of claim 1, wherein the gas recovery opening is radially outward of the gas supply opening.

7. The fluid handling structure of claim 1, wherein the gas recovery opening is radially inward of the gas supply opening.

8. A fluid handling structure for a lithographic apparatus, the fluid handling structure successively having, at a boundary from a space configured to contain immersion fluid to a region external to the fluid handling structure:
a meniscus pinning feature to resist passage of immersion fluid in a radially outward direction from the space;
a gas recovery opening radially outward of the meniscus pinning feature; and
a gas supply opening radially outward of the gas recovery opening, to supply a soluble fluid soluble in the immersion fluid which soluble fluid on dissolution into the immersion fluid lowers the surface tension of the immersion fluid.

9. The fluid handling structure of claim 8, wherein the meniscus pinning feature comprises a single phase extractor.

10. The fluid handling structure of claim 8, further comprising a fluid supply opening radially outwardly of the gas recovery opening.

11. A fluid handling structure for a lithographic apparatus, the fluid handling structure successively having, at a boundary from a space configured to contain immersion fluid to a region external to the fluid handling structure:
a meniscus pinning feature to resist passage of immersion fluid in a radially outward direction from the space;
a gas supply opening radially outward of the meniscus pinning feature;
a fluid supply opening, radially outward of the gas supply opening, to supply a soluble fluid soluble in the immersion fluid which soluble fluid on dissolution into the immersion fluid lowers the surface tension of the immersion fluid; and
a gas recovery opening radially outward of the meniscus pinning feature and at least partly surrounding the gas supply opening.

12. A module for an immersion lithographic apparatus, the module comprising:
a fluid handling structure for a lithographic apparatus, the fluid handling structure having, at a boundary from a space configured to contain immersion fluid to a region external to the fluid handling structure:
a meniscus pinning feature to resist passage of immersion fluid in a radially outward direction from the space,
a gas supply opening radially outward of the meniscus pinning feature, to supply a soluble fluid soluble in the immersion fluid which soluble fluid on dissolution into the immersion fluid lowers the surface tension of the immersion fluid, and
a gas recovery opening radially outward of the meniscus pinning feature and at least partly surrounding the gas supply opening.

13. The module of claim 12, further comprising a gas supplying device configured to supply to the gas supply opening a gas with a solubility in the immersion liquid of greater than $5 \times 10^{-3}$ mol/kg at 20° C. and 1 atm total pressure to a region adjacent the space.

14. The module of claim 12, further comprising a gas supplying device configured to supply to the gas supply opening a gas which reduces the pH of the immersion liquid when dissolved in the immersion liquid.

15. The module of claim 12, further comprising a soluble fluid source of the fluid soluble in the immersion fluid, which soluble fluid upon dissolution in the immersion fluid lowers the surface tension of a meniscus of the immersion fluid, the source being fluidly connected to the fluid supply opening.

16. An immersion lithographic apparatus, the apparatus comprising:
a projection system configured to project a patterned beam of radiation onto a substrate; and
a fluid handling structure for a lithographic apparatus, the fluid handling structure having, at a boundary from a space configured to contain immersion fluid to a region external to the fluid handling structure:
a meniscus pinning feature to resist passage of immersion fluid in a radially outward direction from the space,
a gas supply opening radially outward of the meniscus pinning feature, to supply a soluble fluid soluble in the immersion fluid which soluble fluid on dissolution into the immersion fluid lowers the surface tension of the immersion fluid, and
a gas recovery opening radially outward of the meniscus pinning feature and at least partly surrounding the gas supply opening.

17. A device manufacturing method, comprising:
projecting a patterned beam of radiation through an immersion liquid confined to a space between a final element of projection system and a substrate;
providing gas through an opening to a position adjacent a meniscus of the immersion liquid, the gas being soluble in the immersion fluid which soluble gas on dissolution into the immersion fluid lowers the surface tension of the immersion fluid; and
recovering gas from the opening through a gas recovery opening.

18. The method of claim 17, wherein the gas has a solubility in the immersion liquid of greater than $5 \times 10^{-3}$ mol/kg at 20° C. and 1 atm total pressure to a region adjacent the space.

19. A device manufacturing method, comprising:
projecting a patterned beam of radiation through an immersion liquid confined to a space between a final element of projection system and a substrate;
providing gas through an opening to a position adjacent a meniscus of the immersion liquid;
providing a fluid soluble in the immersion fluid and which soluble fluid upon dissolution in the immersion fluid lowers the surface tension of a meniscus of the immersion fluid;
providing the soluble fluid to a fluid supply opening at a position radially outward of the position at which the gas is provided; and recovering gas from the opening through a gas recovery opening.

20. An immersion lithographic apparatus, the apparatus comprising:
- a projection system configured to project a patterned beam of radiation onto a substrate; and
- a fluid handling structure for a lithographic apparatus, the fluid handling structure successively having, at a boundary from a space configured to contain immersion fluid to a region external to the fluid handling structure:
- a meniscus pinning feature to resist passage of immersion fluid in a radially outward direction from the space;
- a gas recovery opening radially outward of the meniscus pinning feature; and
- a gas supply opening radially outward of the gas recovery opening, to supply a soluble fluid soluble in the immersion fluid which soluble fluid on dissolution into the immersion fluid lowers the surface tension of the immersion fluid.

* * * * *